US012665323B2

(12) United States Patent
Heibler et al.

(10) Patent No.: US 12,665,323 B2
(45) Date of Patent: Jun. 23, 2026

(54) SOLDER CONNECTION BETWEEN A COAXIAL CABLE AND A PRINTED CIRCUIT BOARD ARRANGEMENT AND A MOBILE COMMUNICATION ANTENNA COMPRISING SUCH A SOLDER CONNECTION

(71) Applicant: Telefonaktiebolaget LM Ericsson (publ), Stockholm (SE)

(72) Inventors: Wolfgang Heibler, Ostermünchen (DE); Andreas Scheyer, Tuntenhausen (DE); Wolfgang Heyde, Tuntenhausen (DE); Matthias Riedel, Kiefersfelden (DE); Maximilian Schlosser, Stephanskirchen (DE); Thomas Kapfinger, Ebbs (AT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 413 days.

(21) Appl. No.: 18/248,723

(22) PCT Filed: Oct. 14, 2020

(86) PCT No.: PCT/EP2020/078959

§ 371 (c)(1),
(2) Date: Apr. 12, 2023

(87) PCT Pub. No.: WO2022/078598

PCT Pub. Date: Apr. 21, 2022

(65) Prior Publication Data

US 2023/0378663 A1      Nov. 23, 2023

(51) Int. Cl.
*H01R 4/02*          (2006.01)
*H01R 9/05*          (2006.01)
(Continued)

(52) U.S. Cl.
CPC ........... *H01R 4/023* (2013.01); *H01R 9/0515* (2013.01); *H01R 12/53* (2013.01); *H01R 24/50* (2013.01); *H05K 3/3421* (2013.01)

(58) Field of Classification Search
CPC ....................................................... H01R 4/023
(Continued)

(56) References Cited

U.S. PATENT DOCUMENTS 2,798,113  A      7/1957   Koller et al.
6,575,762  B2     6/2003   Evans
(Continued)

FOREIGN PATENT DOCUMENTS

CN          105592635 B       3/2019
CN          111525261 A       8/2020
(Continued)

OTHER PUBLICATIONS

International Search Report and Written Opinion for International Patent Application No. PCT/EP2020/078959, mailed Jun. 18, 2021, 10 pages.

*Primary Examiner* — Stanley Tso
(74) *Attorney, Agent, or Firm* — Withrow & Terranova, PLLC

(57)          ABSTRACT

A solder connection between a coaxial cable and a printed circuit board arrangement. The coaxial cable comprises an inner conductor, an outer conductor and a dielectric arranged in between. The printed circuit board arrangement comprises an outer conductor contact area and an inner conductor contact area. The outer conductor contact area comprises an outer conductor receiving opening. The coaxial cable runs at an angle to the printed circuit board arrangement, wherein a part of the outer conductor is arranged in the outer conductor receiving opening and wherein the inner conductor is arranged at the inner conductor contact area. A first (Continued)

solder joint connects the outer conductor to the outer conductor contact area. A second solder joint connects the inner conductor to the inner conductor contact area.

15 Claims, 7 Drawing Sheets

(51) Int. Cl.
    *H01R 12/53*         (2011.01)
    *H01R 24/50*         (2011.01)
    *H05K 3/341*         (2026.01)

(58) Field of Classification Search
    USPC ......................................................... 174/251
    See application file for complete search history.

(56)                References Cited

U.S. PATENT DOCUMENTS

| | | | |
|---|---|---|---|
| 2007/0149027 A1 | 6/2007 | Chen et al. | |
| 2017/0331184 A1* | 11/2017 | Langenberg | ........... H01Q 1/246 |
| 2020/0203902 A1* | 6/2020 | Wang | ................... H01R 13/631 |

FOREIGN PATENT DOCUMENTS

| | | | |
|---|---|---|---|
| DE | 102017115225 | * | 7/2017 |
| DE | 102017115225 A1 | | 1/2018 |
| EP | 1887659 A1 | | 2/2008 |
| GB | 2379096 A | | 2/2003 |

* cited by examiner

SOLDER CONNECTION BETWEEN A COAXIAL CABLE AND A PRINTED CIRCUIT BOARD ARRANGEMENT AND A MOBILE COMMUNICATION ANTENNA COMPRISING SUCH A SOLDER CONNECTION

This application is a 35 U.S.C. § 371 national phase filing of International Application No. PCT/EP2020/078959, filed Oct. 14, 2020, the disclosure of which is incorporated herein by reference in its entirety.

TECHNICAL FIELD

The invention relates to a solder connection between a coaxial cable and a printed circuit board arrangement and a mobile communication antenna comprising such a solder connection.

BACKGROUND

Mobile communication antennas comprise a plurality of cable connections. For example, cables are used to connect the respective output ports of a various phase shifters to the plurality of radiators. A printed circuit board (PCB) is also often used to which the cables are connected to.

The CN 105592635 shows a possibility how a coaxial cable can be connected to a printed circuit board. The coaxial cable is arranged at the edge of the printed circuit board and the inner conductor runs parallel to the printed circuit board and lays on the signal line of the printed circuit board.

US 2007/0149027 A1 shows a connection method between a coaxial cable and the printed circuit board. The coaxial cable is inserted into a connector and attached to the connector which in turn is arranged on the printed circuit board.

A problem of these conventional connection methods between a coaxial cable and a printed circuit board is that additional elements like connectors have to be used and/or that the connection can only be achieved close to the edge of the printed circuit board.

SUMMARY

As such, it would be desirable to have a solder connection between a coaxial cable and a printed circuit board arrangement which is inexpensive and which can be added to any part of the printed circuit board arrangement.

The object is solved by a solder connection between a coaxial cable and a printed circuit board arrangement according to claim 1. Claim 15 describes a mobile communication antenna comprising such a solder connection. Claims 2 to 14 describe additional embodiments of the solder connection according to the present invention.

The solder connection between a coaxial cable and a printed circuit board arrangement can preferably be used within a mobile communication antenna. The coaxial cable comprises an inner conductor, and outer conductor and a dielectric. The dielectric is arranged between the inner conductor and the outer conductor. The printed circuit board arrangement comprises an outer conductor contact area which is configured to contact the outer conductor galvanically. The printed circuit board arrangement also comprises an inner conductor contact area which is configured to contact the inner conductor galvanically. The respective contact area could be formed by a metal layer on the printed circuit board arrangement. The printed circuit board arrangement could comprise a printed circuit board made of a single piece or a plurality of printed circuit boards. The outer conductor contact area comprises an outer conductor receiving opening. The coaxial cable runs at an angle (slanted) to the printed circuit board arrangement, wherein a part of the coaxial cable, especially a part of the outer conductor, is arranged in the outer conductor receiving opening and wherein the inner conductor is arranged at the inner conductor contact area. A first solder joint galvanically connects a part of the outer conductor to the outer conductor contact area, wherein a second solder joint galvanically connects at least a part of the inner conductor to the inner conductor contact area.

It is very beneficial that a part of the outer conductor lays within the outer conductor receiving opening, because in that case the outer conductor and also preferably the inner conductor can be connected to the respective contact areas of the printed circuit board arrangement without being bent. The receiving opening also allows that the coaxial cable can be connected to any part of the printed circuit board arrangement (for example in the middle). The wording "at an angle" does not include that the whole end of the coaxial cable where the first and second solder joints are applied to the outer and inner conductors runs perpendicular to the printed circuit board arrangement. The wording "outer conductor" refers to any outer conductor the coaxial cable might have. Preferably, there are more than one outer conductors which are preferably connected to ground, wherein between two outer conductors another dielectric is arranged. Preferably one outer conductor is formed by using a mesh wire. It would also be possible that a metallized foil is used. It is also possible that there are more than one inner conductors.

In another embodiment of the present invention, the outer conductor contact area comprises a metal layer extending at least partially around the outer conductor receiving opening. This metal layer is preferably a layer of the printed circuit board arrangement. In addition or alternatively, the outer conductor contact area comprises a metallization which at least partially covers an inner wall of the outer conductor receiving opening. the metallization could be applied by using a galvanic process. In that case the connection to the respective ground layer of the printed circuit board arrangement is achieved easily.

In another embodiment of the present invention the outer conductor contact area and the inner conductor contact area are free of a solder resist. In that case, solder joints can easily be applied at a specific area on the printed circuit board arrangement. Furthermore, a solder resist and/or a solder resist foil is applied between the outer conductor contact area and the inner conductor contact area. In that case, it is ensured that no continuous solder joint is applied thereby accidentally shorting the inner conductor and the outer conductor.

In another embodiment of the present invention, the outer conductor receiving opening extends through the printed circuit board arrangement partly (only through some but not all layers of the printed circuit board arrangement) or completely (through-hole). The outer conductor receiving opening is further defined by a first and a second end and a first and the second side. The second end is arranged closer to the inner conductor contact area than the first end. The outer conductor receiving opening narrows itself (tapers) towards the first end. The second end comprises a stop (abutment) against which the dielectric of the coaxial cable is in contact with (rests). In that case, the form of the outer conductor receiving opening is adjusted to the form of the slantwise arranged coaxial cable.

In another embodiment of the present invention, the second end comprises rounded corner areas. The stop is located between the two rounded corner areas and is further located closer to the first end than the two rounded corner areas. The two rounded corner areas are preferably arranged closer to the inner conductor contact area than the stop. In that case the outer conductor receiving opening can be manufactured by using a milling or drilling process. It can be said that the outer conductor receiving opening and/or the walls limiting the outer conductor receiving opening are milled parts or drilled parts. By using a microscope for example, the difference can be assessed. Also a punching process could be used to obtain the outer conductor receiving opening. In that case, the outer conductor receiving opening and/or the walls limiting the outer conductor receiving opening are punched parts.

In another embodiment of the present invention, the inner conductor contact area is free of a recess. In that case, the second solder joint is directly applied on the inner conductor and on a metal layer of the printed circuit board arrangement which in turn forms the inner conductor contact area.

In another embodiment of the present invention, the inner conductor contact area comprises an inner conductor receiving hole. The receiving hole is preferably drilled into the printed circuit board arrangement and is more preferably a through-hole. The inner conductor is bent (at its free end which protrudes from the dielectric) and is inserted with its free end into the inner conductor receiving hole.

In another embodiment of the present invention, the inner conductor contact area comprises an inner conductor receiving opening. The inner conductor receiving opening extends partly (only through some but not all layers of the printed circuit board arrangement) or completely through the printed circuit board arrangement (through-hole). The inner conductor contact area comprises a metal layer extending at least partially around the inner conductor receiving opening. This metal layer is preferably a part of the printed circuit board arrangement. In addition or alternatively, the inner conductor contact area comprises a metallization which at least partially covers an inner wall of the inner conductor receiving opening. This metallization could be applied by using a galvanic process. In that case, a reliable solder connection can be obtained, because both, the outer conductor and the inner conductor are arranged within respective openings.

In another embodiment of the present invention, the inner conductor receiving opening is a slotted hole. This ensures that the inner conductor can be arranged easily within the inner conductor receiving opening.

In another embodiment of the present invention, an angle between the coaxial cable and the printed circuit board arrangement at the transition area between the coaxial cable and the printed circuit board arrangement is larger than 5°, 7°, 10°, 11°, 12°, 14°, 16°, 20°, 25°, 30° or larger than 35°. In addition or alternatively, the angle between the coaxial cable and the printed circuit board arrangement at the transition area between the coaxial cable and the printed circuit board arrangement is smaller than 37°, 33°, 28°, 23°, 18°, 15°, 13°, 11°, 9°, 8° or smaller than 6°. Preferably the angle is around 12°. The wording "around" includes deviations of about ±5°. In that case, not much space is needed for wiring the coaxial cables.

In another embodiment of the present invention, the outer conductor contact area and the inner conductor contact area are spaced apart from the nearest edge of the printed circuit board arrangement by more than 2 cm, 3 cm, 4 cm, 5 cm, 6 cm or by more than 7 cm. More preferably, the respective contact area is arranged in the middle region of the printed circuit board arrangement. Such an arrangement would not be possible by using the state-of-the-art solder connections.

In another embodiment of the present invention, the outer conductor contact area and/or the inner conductor contact area comprises a plurality of vias. In that case, a reliable connection having a low-resistance to the respective metal layer of the printed circuit board arrangement is achieved.

In another embodiment of the present invention, the coaxial cable is connected to the printed circuit board arrangement without the use of a connector. It is very beneficial that the coaxial cable only has to be prepared in such a way that the inner conductor is set free. This saves a lot of time and additional costs compared to the state-of-the-art connection methods.

In another embodiment of the present invention, the first and the second solder joints are of a selective wave soldering type or of an automated piston soldering type. In that case, both solder joints can be applied simultaneously. Both solder joints can also be applied in a reliable manner. The soldering could also be done manually.

In another embodiment of the present invention, a holding device is provided. The holding device comprises two elastic support arms. The coaxial cable is clamped between the two elastic support arms. In that case, it is ensured that no force is applied on the solder connection over time.

In another embodiment of the present invention, a part of the outer conductor enters the outer conductor receiving opening and protrudes on the other side. This ensures that a small angle between the coaxial cable and the printed circuit board arrangement can be achieved.

The mobile communication antenna comprises at least one solder connection as described previously. The mobile communication antenna further comprises a reflector arrangement. The reflector arrangement can be made of a single metal piece or of a plurality of metal pieces (for example metal sheets). The reflector arrangement comprises one or more recesses. The one or more recesses is or are at least partially or completely closed by the printed circuit board arrangement. A plurality of radiators is arranged on a first side of the reflector arrangement. A phase shifter arrangement is arranged on a second side of the reflector arrangement. Different outputs of the phase shifter arrangement are connected to a coaxial cable, wherein the coaxial cable is in turn connected to the printed circuit board arrangement via the solder connection. Signal connections of the radiators are connected galvanically to the phase shifter arrangement via the printed circuit board arrangement, the solder connection and the coaxial cable. The reflector arrangement preferably comprises one recess for each of the radiators, wherein each recess is preferably closed by one printed circuit board arrangement. Each radiator is more preferably arranged on the respective printed circuit board arrangement. The metal layer of the respective printed circuit board arrangement is preferably capacitively connected to the reflector arrangement. However, the metal layer of the respective printed circuit board arrangement could also be galvanically connected to the reflector arrangement. This could be done by using additional solder joints and/or by using a screwed connection. The printed circuit board arrangement could also be clipped onto the reflector arrangement by using a snap in connection. Preferably two coaxial cables are fed to each of the respective printed circuit board arrangements thereby providing two signal lines for a first and a second polarization. The radiators could be configured to operate for example in ±45°, horizontal/vertical, elliptic or circular polarization.

The solder connection is configured so that mobile communication signals having a frequency starting from 500 MHz to 6000 MHz can be transmitted. A first frequency range preferably starts from 600 MHz or 650 MHz or 698 MHz ranging up to 960 MHz. Those frequencies are part of the low band. In addition or alternatively, a second frequency range preferably starts from 1698 MHz ranging up to 2700 MHz. Those frequencies are part of the mid-band. In addition or alternatively, a third frequency range preferably starts from 3300 MHz ranging up to 3800 MHz. Those frequencies are part of the high band.

BRIEF DESCRIPTION OF THE DRAWINGS

Different embodiments of the invention will be described in the following, by way of example and with reference to the drawings. The same elements are provided with the same reference signs. The figures show in detail.

DETAILED DESCRIPTION

Figure 1:
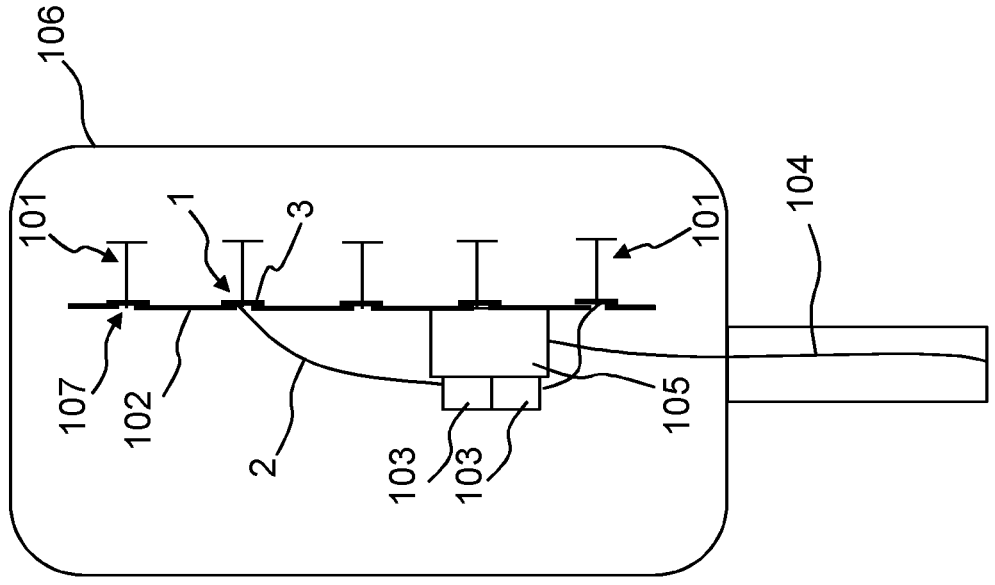
FIG. 1: shows a mobile communication antenna with a solder connection according to the present invention.
Figure 1:
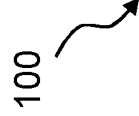

FIG. 1 shows a mobile communication antenna 100 with at least one radiator 101. The radiator 101 is preferably at dual-polarized radiator 101. There is also a reflector arrangement 102. The at least one radiator 101 is arranged on a first side of the reflector arrangement 102. Additional radiators, especially for other frequencies bands could also be arranged on the first side of the reflector arrangement 102. Preferably, a plurality of radiators 101 are used. They are spaced apart from each other in longitudinal direction of the mobile communication antenna 100 and preferably also in the lateral (horizontal) direction. Preferably, the plurality of radiators 101 are configured to be operated in mMIMO. The radiators 101 are preferably configured to transmit and/or receive mobile communication signals in two orthogonal polarizations. The orthogonal polarizations could be for example ±45°, horizontal/vertical, circular or elliptic.

On the second side of the reflector arrangement 102, a phase shifter arrangement 103 for each of the two polarizations for the radiators 101 could be arranged. In addition, a matching network could also be provided. Furthermore, a power amplifier configured to amplify signals which are intended to be transmitted through the mobile communication antenna 100 to various mobile devices could also be arranged on the second side of the reflector arrangement 102. Alternatively or in addition, a low noise amplifier (LNA) could also be arranged on the second side of the reflector arrangement 102. Using the low noise amplifier signals which are received through the mobile communication antenna 100 from various mobile devices could be amplified before being sent to the base station (not shown) via the feeder cables 104. Furthermore, a filter arrangement 105, which could be in the form of a combiner for example, is arranged on the second side of the reflector arrangement 102. A common port of the filter arrangement 105 could be connected to the central port of the respective phase shifter arrangement 103. The TX-port and the RX-port could then be connected to the respective power amplifier or low noise amplifier. A radome 106 closes the mobile communication antenna 100.

The filter arrangement 105 and the respective phase shifter arrangement 103 for each of polarizations of the radiators 101 could be integrated in the same housing. The housing base of the filter arrangement 105 would divide the receiving rooms for the filter arrangement 105 and the phase shifter arrangement 103, wherein an opening between the housing base is used to connect the common port of the filter arrangement 105 to the respective phase shifter arrangement 103. The housing is preferably made of metal, more preferably diecast aluminum. Covers on both sides of the housing then close the respective receiving rooms.

The outputs of the phase shifter arrangement 103 are connected via a solder connection 1 according to the present invention to the respective radiators 101. More precisely, the solder connection 1 is configured to galvanically connect a coaxial cable 2 and the printed circuit board arrangement 3.

In that case, the different outputs of the phase shifter arrangement 103 are each connected to a coaxial cable 2, wherein the coaxial cable 2 is connected to the printed circuit board arrangement 3 via the solder connection 1. Signal connections of the radiators 101 are connected galvanically to the phase shifter arrangement 103 via the printed circuit board arrangement 3, the solder connection 1 and a coaxial cable 2.

The reflector arrangement 102 preferably comprises one or more recesses 107. The one or more recesses 107 is or are at least partially or completely closed off by the printed circuit board arrangement 3. The printed circuit board arrangement 3 is preferably attached to the reflector arrangement 102 by using a snap in connection. A ground layer of the printed circuit board arrangement 3 is preferably capacitively coupled to the reflector arrangement 102. The printed circuit board arrangement 3 is preferably arranged on the first side of the reflector arrangement 102. The printed circuit board arrangement 3 could also be arranged on the second side of the reflector arrangement 102.

The radiators 101 are preferably mounted on the respective printed circuit board arrangement 3. Preferably there is one printed circuit board arrangement 3 for each of the radiators 101.

Radiators 101 could comprise all kind of radiator types. For example, cross dipoles, vector dipoles or patches can be used.

Figures 2, 3:
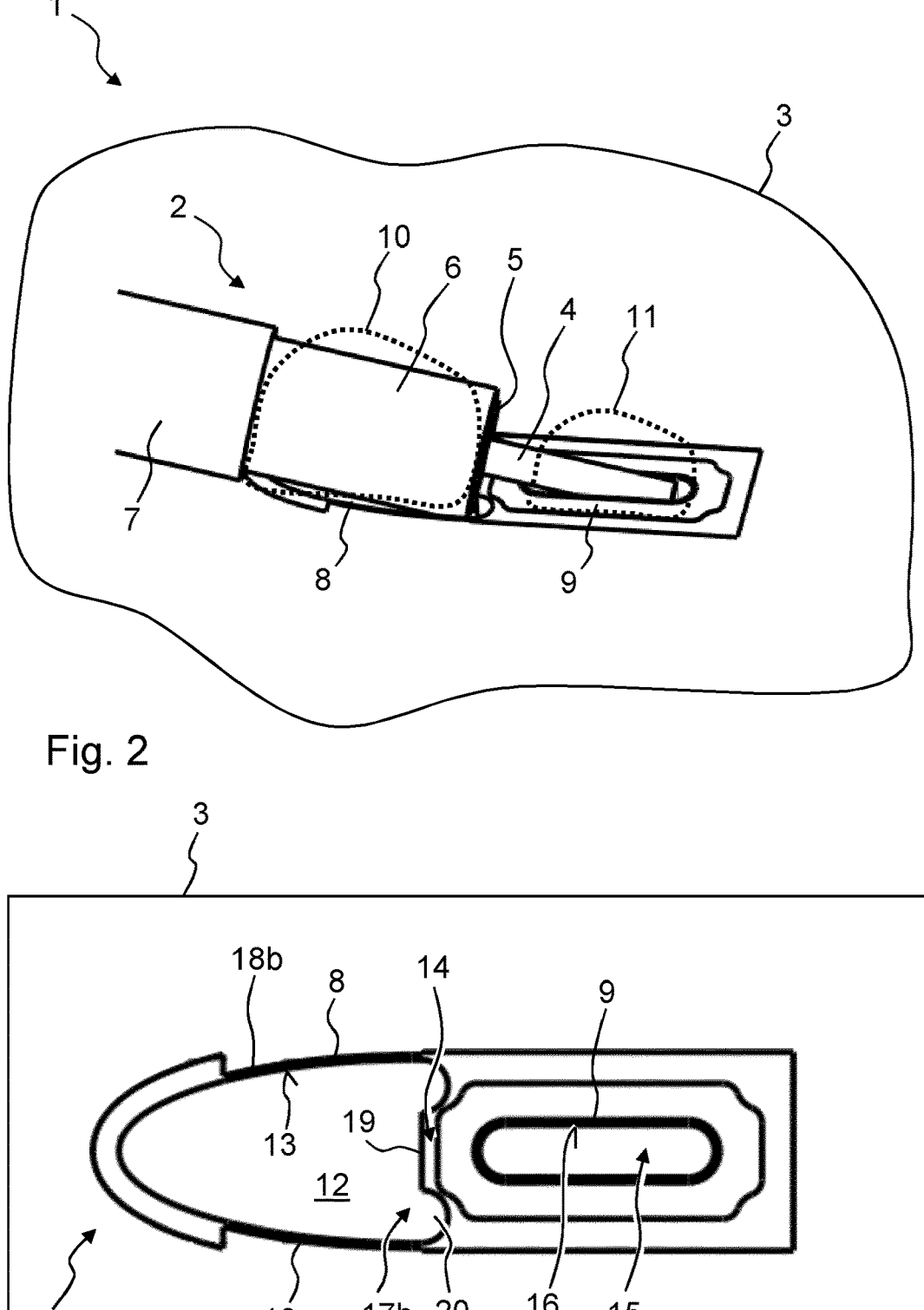
FIG. 2: shows a 3D view of the solder connection between a coaxial cable and a printed circuit board arrangement.
FIG. 3: shows a top view of the printed circuit board arrangement comprising the outer conductor contact area and the inner conductor contact area as well as the outer conductor receiving opening and the inner conductor receiving opening.

FIG. 2 shows a three-dimensional view of the solder connection 1 between the coaxial cable 2 and the printed circuit board arrangement 3. FIG. 3 shows a detailed view of the printed circuit board arrangement 3.

The coaxial cable 2 comprises an inner conductor 4, a dielectric 5 and an outer conductor 6. The other conductor 6 is preferably a mesh wire which preferably comprises or consists of copper. The mesh wire is further preferably tin plated. There could also be more than one outer conductor 6. However, between each of the outer conductors 6, a dielectric is preferably arranged.

The outer conductor 6 could also be covered by a further dielectric cover 7. In order to establish the solder connection 1, the outer conductor 6 as well as the inner conductor 4 have to be set free so that they are visible.

The outer conductor 6 protrudes from the dielectric cover 7. Furthermore, it is possible, that the dielectric 5 protrudes from the outer conductor 6. However, the dielectric 5 could also end flush at the outer conductor 6. In that case the dielectric 5 would not protrude the outer conductor 6. The inner conductor 4 protrudes the dielectric 5.

The printed circuit board arrangement 3 comprises an outer conductor contact area 8 which is configured to contact the outer conductor 6 galvanically. Furthermore, the printed circuit board arrangement 3 comprises an inner conductor contact area 9 which is configured to contact the inner conductor 4 galvanically.

A first solder joint 10 (dotted line) galvanically connects at least a part of the outer conductor 6 to the outer conductor contact area 8. A second solder joint 11 (dotted line) galvanically connects at least a part of the inner conductor 4 to the inner conductor contact area 9.

The outer conductor contact area 8 comprises an outer conductor receiving opening 12. The other conductor receiving opening 12 is preferably a through-hole and extends through the printed circuit board arrangement 3 completely.

The coaxial cable 2 runs at an angle α (see FIGS. 4B, 4C) to the printed circuit board arrangement. The angle between the coaxial cable 2 and the printed circuit board arrangement 3 at the transition area between the coaxial cable 2 and the printed circuit board arrangement 3 is preferably larger than 5°, 7°, 10°, 11°, 12°, 14°, 16°, 20°, 25°, 30° or larger than 35°. In addition or alternatively, the angle between the coaxial cable 2 and the printed circuit board arrangement 3 at the transition area between the coaxial cable 2 and the printed circuit board arrangement 3 is smaller than 37°, 33°, 28°, 23°, 18°, 15°, 13°, 11°, 9°, 8° or smaller than 6°. More preferably, the angle α is around 12°.

The outer conductor contact area 8 comprises a metal layer which extends at least partially around the outer conductor receiving opening 12. In addition or alternatively, the outer conductor contact area 8 comprises a metallization which at least partially covers an inner wall 13 of the outer conductor receiving opening 12.

The outer conductor contact area 8 and the inner conductor contact area 9 are free of the solder resist. In that case, the respective first and second solder joints 10, 11 can be applied to the outer and inner conductor contact areas 8, 9.

However, a solder resist 14 is applied between the outer conductor contact area 8 and the inner conductor contact area 9. As such, it is avoided, that the first and the second solder joints 10, 11 are connected to each other thereby forming one single solder joint. Therefore, a selective wave soldering process can be used. An automated piston soldering process could also be used.

FIGS. 2 and 3 also show that the inner conductor contact area 9 comprises an inner conductor receiving opening 15. The inner conductor receiving opening extends completely through the printed circuit board arrangement 3. The inner conductor contact area 9 comprises a metal layer extending at least partially around the inner conductor receiving opening 15. In addition or alternatively, the inner conductor contact area 9 comprises a metallization which at least partially covers an inner wall 16 of the inner conductor receiving opening 15.

Furthermore, the inner conductor receiving opening 15 is in the form of a slotted hole. The slotted hole has preferably a length of about 4.5 mm. The wording "about" includes deviations which are preferably less than ±20%, ±15%, ±10% or less than ±5%. The inner conductor receiving opening 15 can preferably made by a milling or drilling process.

The outer conductor receiving opening 12 is defined by a first and a second end 17a, 17b and a first and a second side 18a, 18b. The second end 17b is located closer to the inner conductor contact area 9 then the first end 17a. The outer conductor receiving opening 12 tapers towards the first end 17a. The outer conductor receiving opening 12 has preferably the shape of a flat iron. The second end 17b comprises a stop 19 against which the dielectric 5 of the coaxial cable 2 rests.

The second end 17b also comprises rounded corner areas 20. The stop 19 is located between the two rounded corner areas 20 and is also located closer to the first end 17a then the two rounded corner areas 20. This means that the stop 19 protrudes from the two rounded corner areas 20. The outer conductor receiving opening 12 can preferably made by milling or drilling process.

A distance between the first end 17a and the stop 19 is preferably around 5.8 mm. The wording "around" includes deviations which are preferably less than ±20%, ±15%, ±10% or less than ±5%.

The largest distance between the first side 18a and the second side 18b is preferably around 3.5 mm. The wording "around" includes deviations which are preferably less than ±20%, ±15%, ±10% or less than ±5%.

Figures 4A, 4B, 4C, 4D:
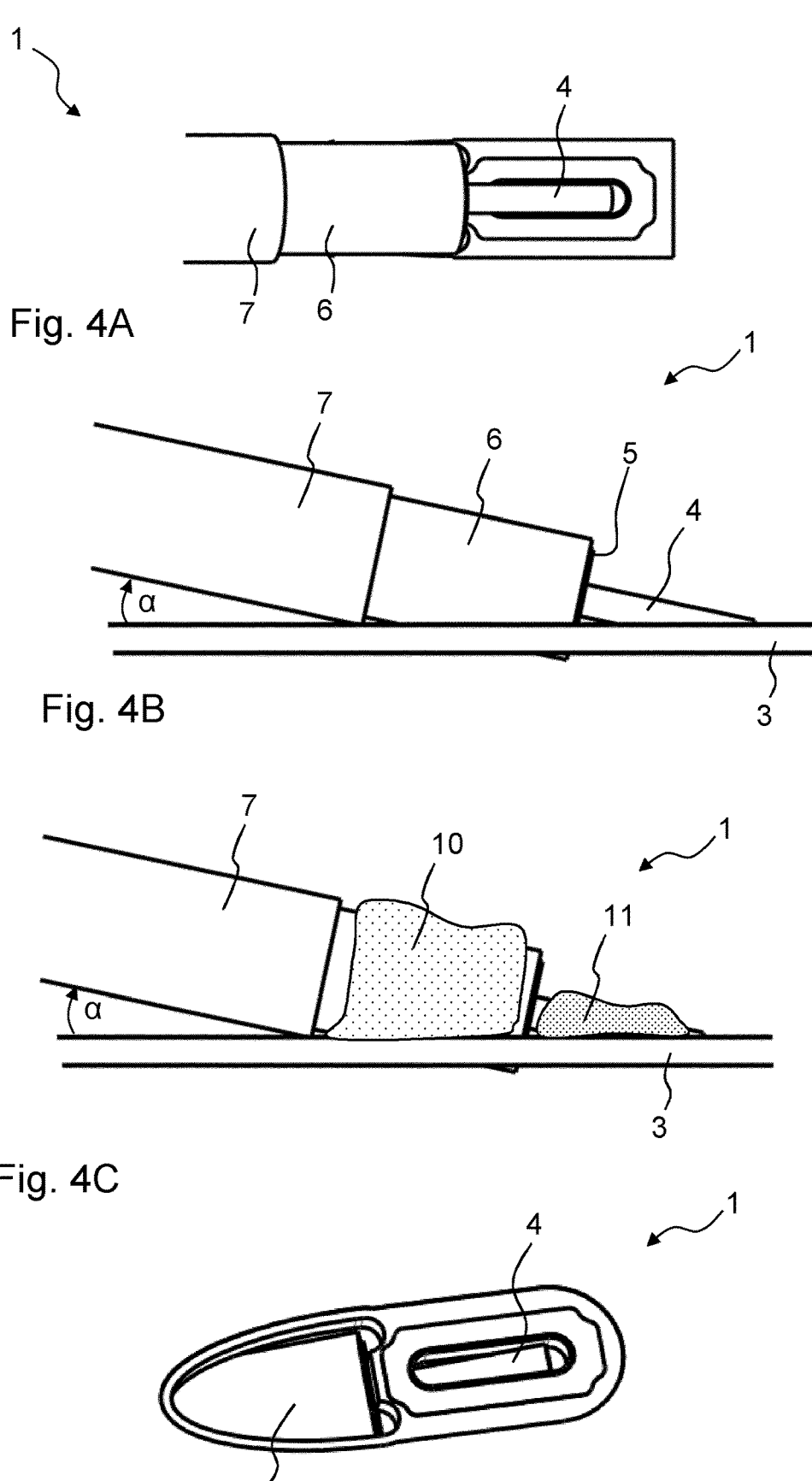
FIG. 4A, 4B, 4C, 4D: show various views of the solder connection between the coaxial cable and the printed circuit board arrangement.

FIG. 4A shows a top view of the solder connection 1.

The outer conductor 6 protrudes the dielectric cover 7 by a length of approximately about 10 mm. The wording "about" includes deviations which are preferably less than ±20%, ±15%, ±10% or less than ±5%.

The dielectric 5 may or may not protrude the outer conductor 6. If the dielectric 5 protrudes the outer conductor 6, the dielectric 5 preferably protrudes the outer conductor 6 by a length of about 1 mm. The wording "about" includes deviations which are preferably less than ±20%, ±15%, ±10% or less than ±5%.

Within FIG. 4, the inner conductor 4 protrudes the dielectric 5 by a length of about 5 mm. The wording "about" includes deviations which are preferably less than ±20%, ±15%, ±10% or less than ±5%.

A diameter of the outer conductor 6 is preferably about 3.6 mm. The wording "about" includes deviations which are preferably less than ±20%, ±15%, ±10% or less than ±5%.

A diameter of the dielectric 5 is preferably about 3 mm. The wording "about" includes deviations which are preferably less than ±20%, ±15%, ±10% or less than ±5%.

A diameter of the inner conductor 4 is preferably about 0.93 mm. The wording "about" includes deviations which are preferably less than ±20%, ±15%, ±10% or less than ±5%.

Preferably, no external elements are needed in order to keep the coaxial cable 2 in position.

FIGS. 4B and 4C describe the angle α. The angle α towards the printed circuit board arrangement 3 is preferably measured starting at the visible outer conductor 6 or at the dielectric cover 7 which is arranged next to the outer conductor 6.

It is also shown that a part 21 of the outer conductor 6 which enters the outer conductor receiving opening 12 protrudes on the other side of the printed circuit board arrangement 3.

FIG. 4D shows a bottom view of the printed circuit board arrangement 3. However, the wording "bottom" should not be understood in a limiting manner. On that side of the printed circuit board arrangement 3, the radiators 101 are preferably arranged. When facing the radiators 101, the "bottom" side could also be the front side of the mobile communication antenna 100.

Figure 5A:
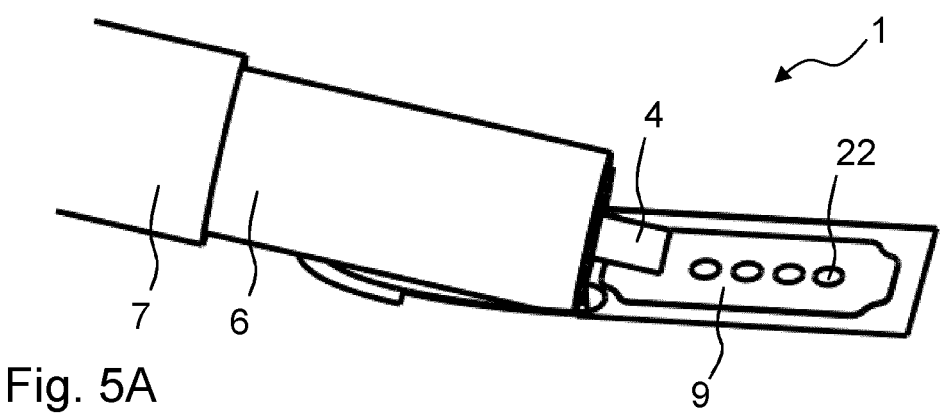
FIG. 5A: shows an embodiment of a solder connection, wherein the inner conductor contact area is free of a recess.

FIG. 5A shows another embodiment of the solder connection 1. In that case, the inner conductor contact area 9 is free of a recess. as can be seen, the inner conductor 4 is shorter in length compared to the inner conductor 4 used for our slotted hole. Preferably, the inner conductor 4 has a length of about 2 mm. The wording "about" includes deviations which are preferably less than ±20%, ±15%, ±10% or less than ±5%.

The inner conductor contact area 9 comprises a plurality of vias 22, thereby galvanically connecting two metal layers of the printed circuit board arrangement 3 on opposite sides of the printed circuit board arrangement 3. The vias 22 are preferably arranged in the same plane as the inner conductor 4. The plane is preferably aligned perpendicular to the printed circuit board arrangement 3.

Figure 5B:
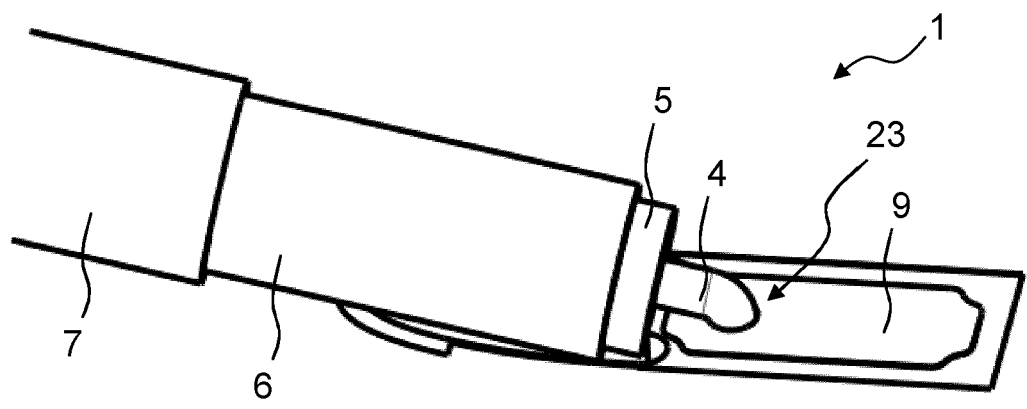
FIG. 5B: shows an embodiment of a solder connection, wherein the inner conductor contact area comprises a hole, wherein the inner conductor is bent at its free end and inserted into the hole.

FIG. 5B shows that the inner conductor contact area 9 comprises an inner conductor receiving hole 23. The inner conductor receiving hole 23 preferably extends through the printed circuit board arrangement 3 completely. The inner conductor 4 is bent and is inserted with its free end into the inner conductor receiving hole 23. Preferably only a part of the protruding inner conductor 4 is bent and not the whole protruding inner conductor 4. The bent angle is preferably larger than 90°, 100°, 110°, 120° or larger than 130°.

Figure 5C:
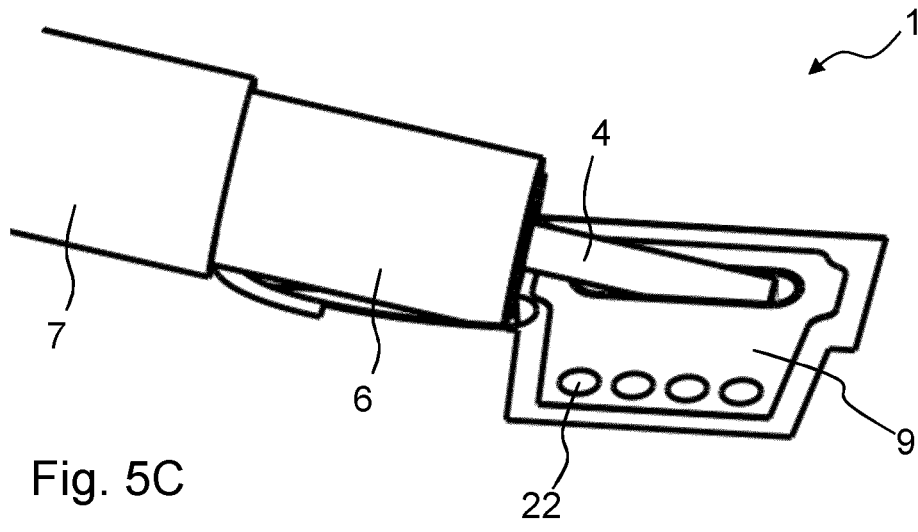
FIG. 5C: shows an embodiment of a solder connection, wherein the inner conductor contact area comprises an inner conductor receiving opening in form of the slotted hole.

FIG. 5C shows again the use of an inner conductor receiving opening 15 in the form of a slotted hole. In addition, the inner conductor contact area 9 further comprises vias 22, thereby galvanically connecting two metal layers of the printed circuit board arrangement 3 on opposite sides of the printed circuit board arrangement 3. The vias 22 are preferably arranged along a line parallel to the inner conductor receiving opening 15.

Figure 7:
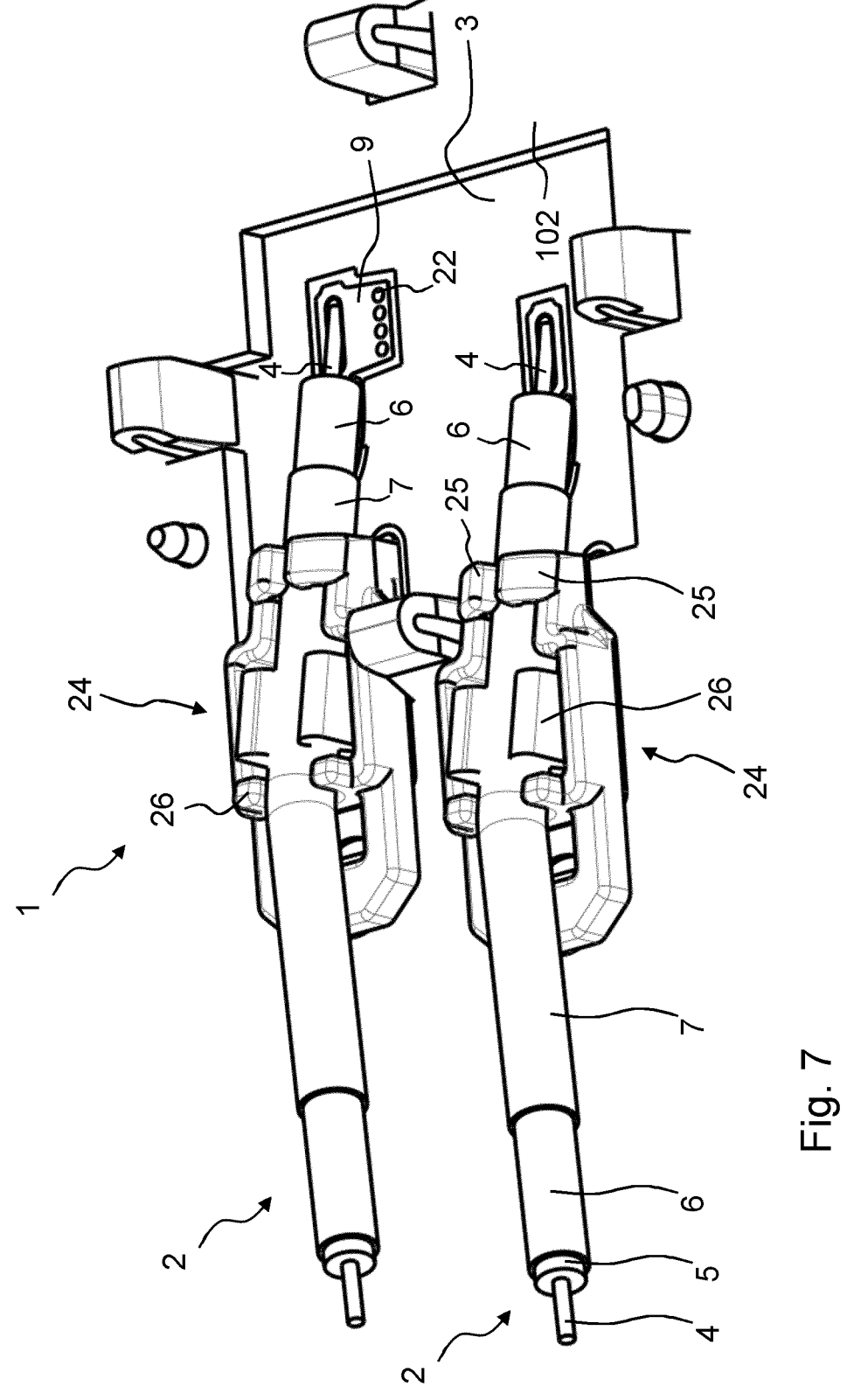
FIG. 7: shows an embodiment of the solder connection between a coaxial cable and the printed circuit board arrangement, wherein the coaxial cable is held by a holding device.

FIG. 7 shows an embodiment of the solder connection 1 between the coaxial cable 2 and the printed circuit board arrangement 3, wherein the coaxial cable 2 is held by a holding device 24. The holding device 24 comprises at least two elastic support aims 25. The coaxial cable 2 is clamped between the two elastic support aims 25. There could also be additional supporting members 26 which are used to hold the coaxial cable 2 in position. The additional supporting members 26 would be spaced apart in the longitudinal direction of the coaxial cable 2 from the support arms 25. The additional supporting members 26 would also be arranged on two sides of the coaxial cable 2.

The holding device 24 is preferably made of a dielectric like plastic. The holding device 24 is further preferably attached to the second side of the reflector arrangement 102 and/or to the printed circuit board arrangement 3. The attachment is preferably a snap in connection. The holding device 24 is preferably made of a single piece.

Within FIG. 7 two holding devices 24 are shown, so that two coaxial cables 2 can be galvanically connected to a printed circuit board arrangement 3. The two inner conductor contact areas 9 of the printed circuit board arrangement 3 could be of the same type or as FIG. 7 shows of different types.

There could also be only one holding device 24 which is configured to hold two coaxial cables 2 simultaneously. Such a holding device 24 could also be made of a single piece.

The holding device 24 preferably absorbs a tensile force and a torsional force.

As can be seen, the outer conductor contact area 8 and the inner conductor contact area 9 are spaced apart from the nearest edge of the printed circuit board arrangement 3 by more than 2 cm, 3 cm, 4 cm, 5 cm, 6 cm or by more than 7 cm. More preferably, the outer conductor contact area 8 and/or the inner conductor contact area 9 could even be arranged in the middle of the printed circuit arrangement 3. Such an arrangement would not be possible by using the connection elements described in the state-of-the-art.

Figure 6:
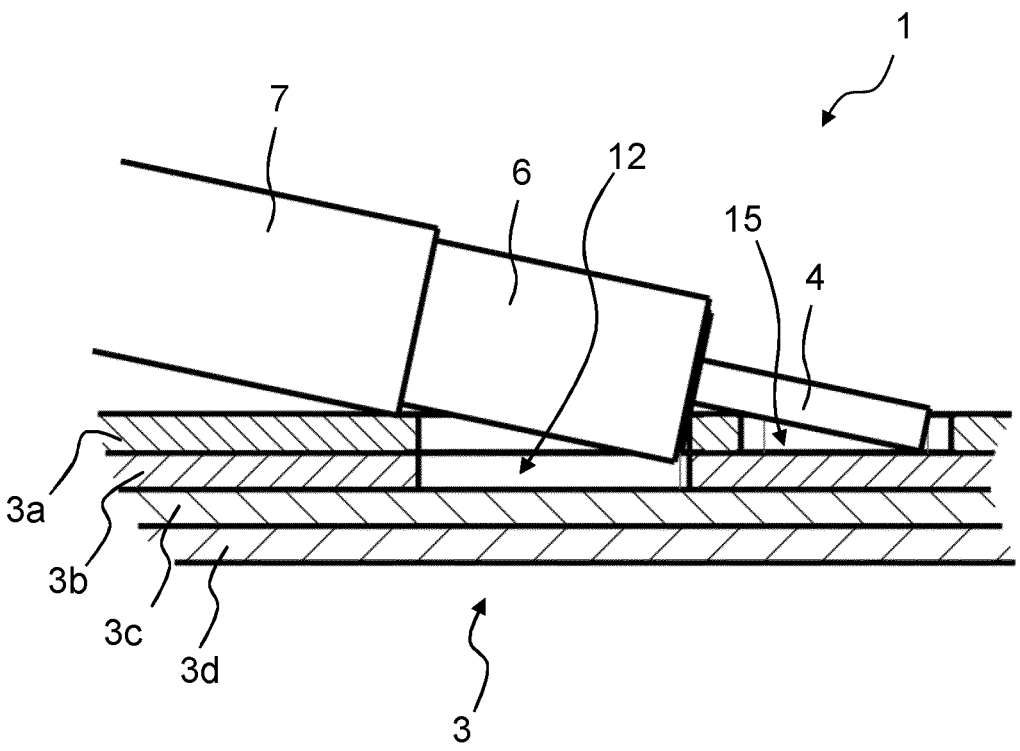
FIG. 6: shows an embodiment of a solder connection, wherein the printed circuit board arrangement comprises a plurality of layers, wherein the outer conductor receiving opening and the inner conductor receiving opening only partly extend through the printed circuit board arrangement.

FIG. 6 shows that the printed circuit arrangement 3 comprises a plurality of layers 3a, 3b, 3c, 3d. As can be seen, the outer conductor receiving opening 12 extends only partly through the printed circuit board arrangement 3. In that case, only the first two layers 3a, 3b comprise the outer conductor the receiving opening 12. The remaining layers 3c, 3d are free of the outer conductor receiving opening 12. The amount of layers 3a, 3b, 3c, 3d the printed circuit board arrangement 3 could comprise can be chosen on the respective needs.

The outer conductor receiving opening 12 can be pressed into the respective layer 3a, 3b, 3c, 3d before all the layers 3a, 3b, 3c, 3d are clued together for example. Also a milling and/or thrilling process could be used.

FIG. 6 also shows that the inner conductor receiving opening 15 extends only partly through the printed circuit board arrangement 3 and not through the whole printed circuit board arrangement 3. In that case, only the first two layers 3a, 3b comprise the inner conductor receiving opening 15. The remaining layers 3c, 3d are free of the inner conductor receiving opening 15. The amount of layers 3a, 3b, 3c, 3d the printed circuit board arrangement 3 could comprise can be chosen on the respective needs. The inner conductor receiving opening 15 can be pressed into the respective layer 3a, 3b, 3c, 3d before all the layers 3a, 3b, 3c, 3d are clued together for example. Also a milling and/or thrilling process could be used.

Within FIGS. 4a, 4B, 4D, 5A, 5B, 5C, 6 and 7 no first and second solder joints 10, 11 are shown.

Figure 8:
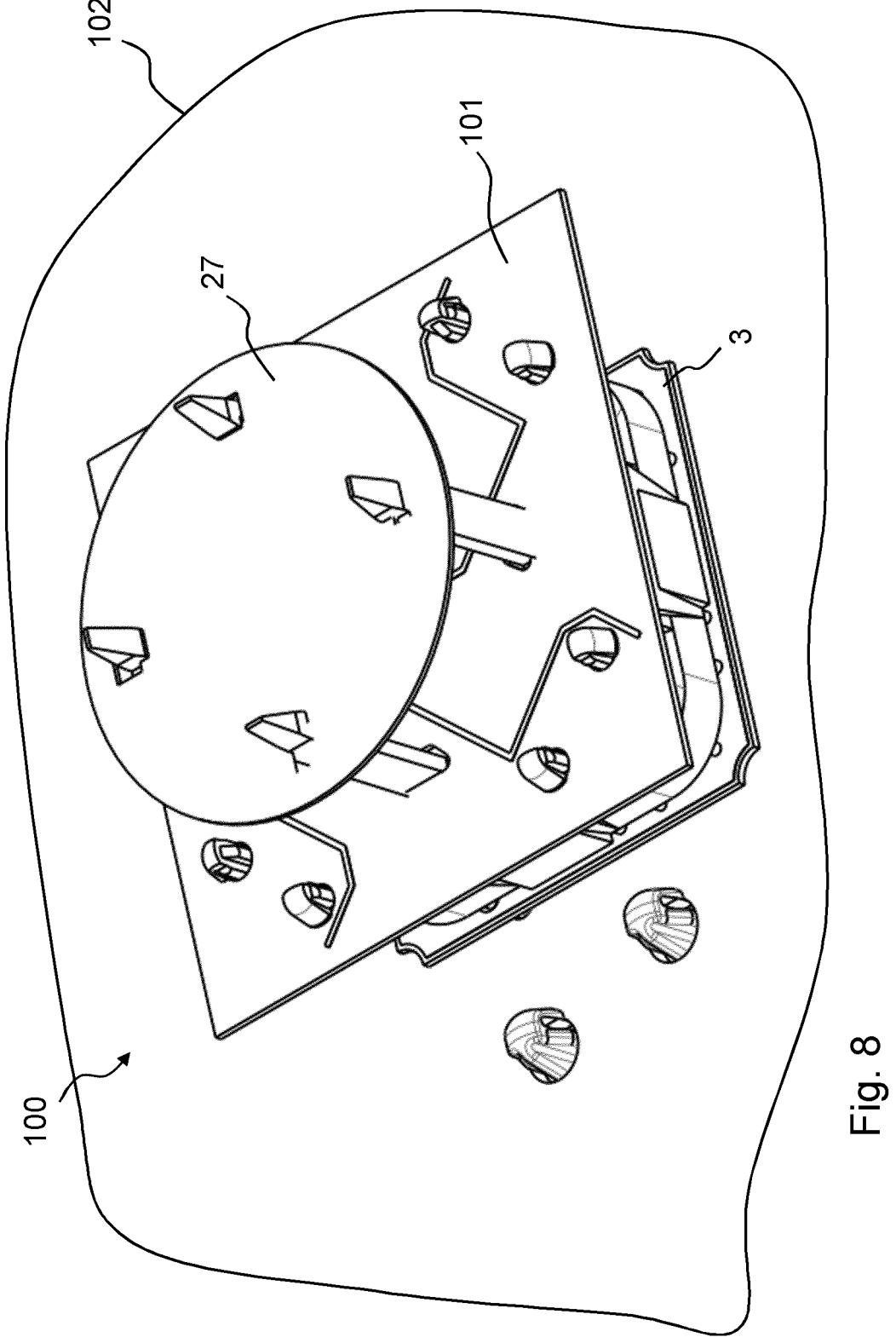
FIG. 8: shows a 3D view of a radiator that is mounted on top of the printed circuit board arrangement.

FIG. 8 shows a three-dimensional view of a radiator 101 that is mounted on top of the printed circuit board arrangement 3. The radiator 101 is a patch radiator arranged on a printed circuit board. On top of the radiator 101 a conductive piece of metal is placed which forms a director 27. The director 27 is preferably of a circular shape. The patch radiator 101 which is established on a printed circuit board is connected to the printed circuit board arrangement 3 by further use of vertically arranged printed circuit boards or by sheet-metal or by a further cable connection. The radiator 101 could be connected via a snap in connection with the printed circuit board arrangement 3. Furthermore, the director 27 could also be connected via a snap in connection with the radiator 101.

The printed circuit board arrangement 3 could also comprise a matching network. The impedance of the inner conductor contact area 9 and the outer conductor contact area 8 is preferably 50 ohm.

In the following some advantages of the solder connection 1 are emphasized separately.

The solder connection 1 preferably comprises the following feature:

the coaxial cable 2 is free of any bends at the transition area between the coaxial cable 2 and the printed circuit board arrangement 3.

The solder connection 1 preferably comprises the following features:

the printed circuit board arrangement 3 comprises a dielectric;

the dielectric of the printed circuit board arrangement 3 comprises polytetrafluorethylene or a ceramic or consists of polytetrafluorethylene or a ceramic.

The solder connection 1 preferably comprises the following feature:

the first and the second solder joints 10, 11 are only arranged on that side of the printed circuit board arrangement 3 that is visible from the second side of the reflector arrangement 102.

The solder connection 1 preferably comprises the following feature:

the printed circuit board arrangement 3 is free of any electrical connection to other elements beyond the printed circuit board arrangement 3 with the exception of an electrical connection to the respective radiator 101 and to the at least one coaxial cable 2.

The solder connection 1 preferably comprises the following feature:

the printed circuit board arrangement 3 is free of any active elements like amplifiers.

The solder connection 1 preferably comprises the following feature:

the printed circuit board arrangement 3 comprises two metal layers, wherein both metal layers are separated from each other by a dielectric.

The solder connection 1 preferably comprises the following feature:

the holding device 24 is configured to be connected with the reflector arrangement 102 and/or the printed circuit board arrangement 3.

The "solder connection" comprises at least the coaxial cable 2 and the printed circuit board arrangement 3 as well as the first and the second solder joints 10, 11. The wording "solder connection" could also be replaced with the wording "solder system", "solder compound" or "solder arrangement". The wording "solder connection" could also be replaced with the generic wording "system" which at least comprises the coaxial cable 2 and the printed circuit board arrangement 3 as well as the first and the second solder joints 10, 11. The holding device 24 could also be part of the above mentioned terms.

Some of the embodiments contemplated herein are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A solder connection between a coaxial cable and a printed circuit board arrangement, in particular for a mobile communication antenna, comprising the following features:

the coaxial cable comprises an inner conductor, an outer conductor and a dielectric, wherein the dielectric is arranged between the inner conductor and the outer conductor;

the printed circuit board arrangement comprises an outer conductor contact area which is configured to contact the outer conductor galvanically and an inner conductor contact area which is configured to contact the inner conductor galvanically;

the outer conductor contact area comprises an outer conductor receiving opening;

the coaxial cable runs at an angle to the printed circuit board arrangement, wherein a part of the outer conductor is arranged in the outer conductor receiving opening and wherein the inner conductor is arranged at the inner conductor contact area;

a first solder joint galvanically connects at least a part of the outer conductor to the outer conductor contact area;

a second solder joint galvanically connects at least a part of the inner conductor to the inner conductor contact area, wherein the outer conductor receiving opening extends through the printed circuit board arrangement completely.

2. The solder connection according to claim 1, characterized by the following features:

the outer conductor contact area comprises a metal layer extending at least partially around the outer conductor receiving opening; and/or the outer conductor contact area comprises a metallization which at least partially covers an inner wall of the outer conductor receiving opening.

3. The solder connection according to claim 1, characterized by the following features:

the outer conductor contact area and the inner conductor contact area are free of solder resist;

solder resist and/or a solder resist foil is applied between the outer conductor contact area and the inner conductor contact area.

4. The solder connection according to claim 1, characterized by the following features:

the outer conductor receiving opening extends through the printed circuit board arrangement partly or completely;

the outer conductor receiving opening is defined by a first and a second end and a first and a second side;

the second end is located closer to the inner conductor contact area than the first end;

the outer conductor receiving opening tapers toward the first end;

the second end comprises a stop against which the dielectric of the coaxial cable is in contact with.

5. The solder connection according to claim 4, characterized by the following features:

the second end comprises rounded corner areas;

the stop is located between the two rounded corner areas and is located closer to the first end than the two rounded corner areas.

6. The solder connection according to claim 1, characterized by the following feature:

the inner conductor contact area is free of a recess.

7. The solder connection according to claim 1, characterized by the following features:

the inner conductor contact area comprises an inner conductor receiving hole;

the inner conductor is bent and inserted with its free end into the inner conductor receiving hole.

8. The solder connection according to claim 1, characterized by the following features:

the inner conductor contact area comprises an inner conductor receiving opening;

the inner conductor receiving opening extends partly or completely through the printed circuit board arrangement;

the inner conductor contact area comprises a metal layer extending at least partially around the inner conductor receiving opening; and/or the inner conductor contact area comprises a metallization which at least partially covers an inner wall of the inner conductor receiving opening.

9. The solder connection according to claim 8, characterized by the following feature:

the inner conductor receiving opening is a slotted hole.

10. The solder connection according to claim 1, characterized by the following features:

an angle (α) between the coaxial cable and the printed circuit board arrangement at the transition area between the coaxial cable and the printed circuit board arrangement is larger than 5°, 7°, 10°, 11°, 12°, 14°, 16°, 20°, 25°, 30° or larger than 35°; and/or an angle (α) between the coaxial cable and the printed circuit board arrangement at the transition area between the coaxial cable and the printed circuit board arrangement is smaller than 37°, 33°, 28°, 23°, 18°, 15°, 13°, 11°, 9°, 8° or smaller than 6°.

11. The solder connection according to claim 1, characterized by the following features:

the outer conductor contact area and the inner conductor contact area are spaced apart from the nearest edge of the printed circuit board arrangement by more than 2 cm, 3 cm, 4 cm, 5 cm, 6 cm or by more than 7 cm; and/or the outer conductor contact area and/or the inner conductor contact area comprises a plurality of vias.

12. The solder connection according to claim 1, characterized by the following features:

the coaxial cable is connected to the printed circuit board arrangement without the use of a connector; and/or the first and the second solder joints are of a selective wave soldering type or of an automated piston soldering type.

13. The solder connection according to claim 1, characterized by the following features:

a holding device is provided;

the holding device comprises two elastic support arms;

the coaxial cable is clamped between the two elastic support arms.

14. The solder connection according to claim 1, characterized by the following feature:

a part of the outer conductor enters the outer conductor receiving opening and protrudes on the other side.

15. A mobile communication antenna with a solder connection between a coaxial cable and a printed circuit board arrangement, in particular for the mobile communication antenna, wherein:

the solder connection comprises the following features:

the coaxial cable comprises an inner conductor, an outer conductor and a dielectric, wherein the dielectric is arranged between the inner conductor and the outer conductor;

the printed circuit board arrangement comprises an outer conductor contact area which is configured to contact the outer conductor galvanically and an inner conductor contact area which is configured to contact the inner conductor galvanically;

the outer conductor contact area comprises an outer conductor receiving opening;

the coaxial cable runs at an angle to the printed circuit board arrangement, wherein a part of the outer conductor is arranged in the outer conductor receiving opening and wherein the inner conductor is arranged at the inner conductor contact area;

a first solder joint galvanically connects at least a part of the outer conductor to the outer conductor contact area; and a second solder joint galvanically connects at least a part of the inner conductor to the inner conductor contact area, wherein the outer conductor receiving opening extends through the printed circuit board arrangement completely; and the mobile communication antenna is characterized by the following features:

a reflector arrangement is provided;

the reflector arrangement comprises one or more recesses;

the one or more recesses is or are at least partially or completely closed off by the printed circuit board arrangement;

a plurality of radiators is arranged on a first side of the reflector arrangement;

a phase shifter arrangement is arranged on a second side of the reflector arrangement;

different outputs of the phase shifter arrangement are connected to a coaxial cable, wherein the coaxial cable is connected to the printed circuit board arrangement via the solder connection;

signal connections of the radiators are connected galvanically to the phase shifter arrangement via the printed circuit board arrangement, the solder connection and the coaxial cable.

* * * * *